US010964778B2

(12) United States Patent
Fernandes et al.

(10) Patent No.: US 10,964,778 B2
(45) Date of Patent: Mar. 30, 2021

(54) PRECISION CAPACITOR

(71) Applicant: Texas Instruments Incorporated, Dallas, TX (US)

(72) Inventors: Poornika Fernandes, Murphy, TX (US); Luigi Colombo, Dallas, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 15/902,764

(22) Filed: Feb. 22, 2018

(65) Prior Publication Data
US 2019/0259826 A1 Aug. 22, 2019

(51) Int. Cl.
*H01L 49/02* (2006.01)
*H01L 21/02* (2006.01)
*H01L 27/06* (2006.01)
*H01G 4/08* (2006.01)
*H01L 29/06* (2006.01)

(52) U.S. Cl.
CPC ............. *H01L 28/40* (2013.01); *H01G 4/085* (2013.01); *H01L 21/022* (2013.01); *H01L 21/0217* (2013.01); *H01L 21/02164* (2013.01); *H01L 21/02211* (2013.01); *H01L 21/02274* (2013.01); *H01L 27/0629* (2013.01); *H01L 29/0649* (2013.01)

(58) Field of Classification Search
CPC ... H01L 28/56; H01L 21/67739; H01L 28/40; H01L 21/02274; H01L 27/0629; H01L 29/0649; C23C 16/455; H01G 4/018; H01G 4/085; H03M 1/12
USPC .................................................. 257/532, 438
See application file for complete search history.

(56) References Cited

U.S. PATENT DOCUMENTS

| 5,397,748 A * | 3/1995 | Watanabe ............... H01L 28/40 438/762 |
| 6,680,521 B1 | 1/2004 | Kar-Roy et al. |
| 7,041,569 B1 | 5/2006 | Kar-Roy et al. |
| 2013/0157466 A1* | 6/2013 | Fox ................... C23C 16/45523 438/694 |
| 2015/0214150 A1* | 7/2015 | Chang ................. H01L 23/5286 257/529 |
| 2016/0104621 A1 | 4/2016 | Zang |
| 2016/0163782 A1 | 6/2016 | Campbell et al. |

* cited by examiner

*Primary Examiner* — Hrayr A Sayadian
(74) *Attorney, Agent, or Firm* — Rose Alyssa Keagy; Charles A. Brill; Frank D. Cimino

(57) ABSTRACT

In a described example, an integrated circuit includes a capacitor first plate; a dielectric stack over the capacitor first plate comprising silicon nitride and silicon dioxide with a capacitance quadratic voltage coefficient less than 0.5 ppm/$V^2$; and a capacitor second plate over the dielectric stack.

11 Claims, 3 Drawing Sheets

PRECISION CAPACITOR

CROSS-REFERENCE TO RELATED APPLICATIONS

The following related co-owned and co-pending patent application is hereby incorporated by reference in its entirety herein: U.S. patent application Ser. No. 15/902,829, filed contemporaneously.

TECHNICAL FIELD

This disclosure relates generally to integrated circuits, and more particularly to integrated circuits with high voltage and high precision capacitors.

BACKGROUND

A capacitor is an electrical device found in many integrated circuits and is used to store electrical charge and in some applications, to measure electrical charge. Precision capacitors are used to convert analog signals to digital voltage values. Improvements in embedded precision capacitors are needed.

SUMMARY

In a described example, an integrated circuit includes an embedded precision capacitor with a dielectric stack of silicon dioxide and silicon nitride having a capacitance quadratic voltage coefficient of less than 0.5 ppm/V$^2$. A method for forming an integrated circuit with an embedded capacitor includes: forming a capacitor first plate over a substrate; and depositing over the capacitor first plate a dielectric stack of alternating layers of plasma enhanced chemical vapor deposition (PECVD) silicon dioxide and PECVD silicon nitride, where the silicon nitride has an atomic hydrogen content less than 25% and the silicon nitride is deposited using N$_2$ as a nitrogen source while applying radio frequency low frequency power.

DETAILED DESCRIPTION

Corresponding numerals and symbols in the different figures generally refer to corresponding parts unless otherwise indicated. The figures are not necessarily drawn to scale.

The term "RF-LF" is used herein as an abbreviation for "radio frequency low frequency". An RF-LF signal is sometimes applied during dielectric depositions in processes using plasma enhanced chemical vapor deposition in the range of 0-500 kHz. The term "RF-HF" is used herein to abbreviate the term "radio frequency high frequency". An RF-HF signal applied during dielectric depositions PECVD is in the range of 10-20 MHz and is often 13.56 MHz, a selected frequency that is available for industrial applications without interfering with other radio frequency signals.

Figure 1:
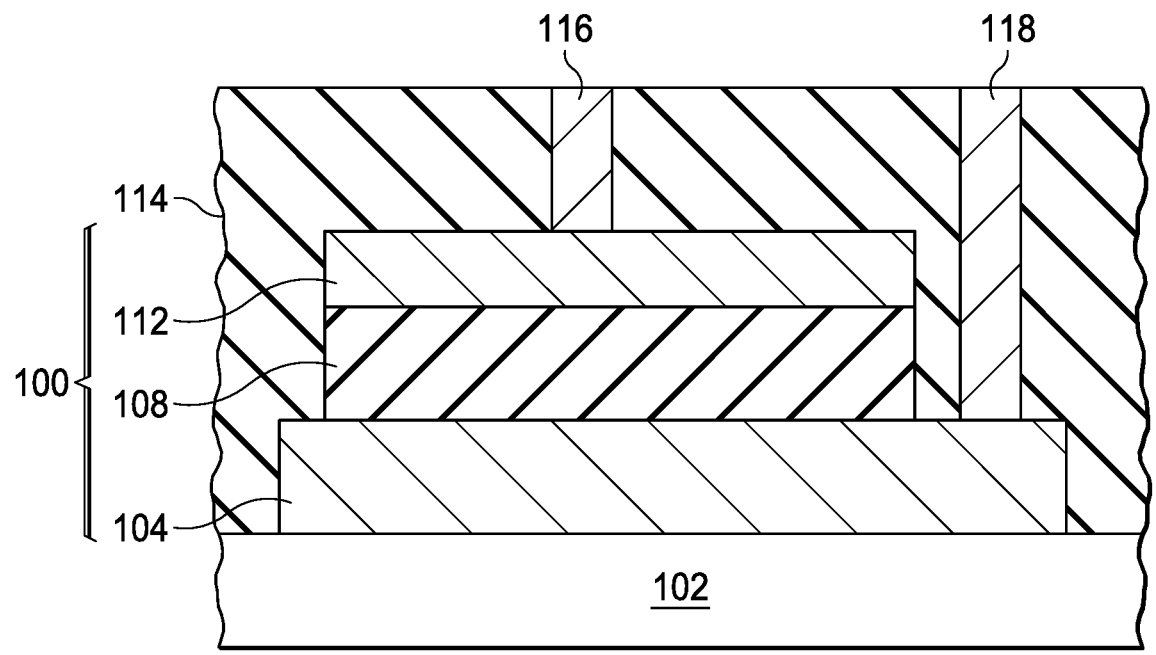
FIG. 1 is a cross section of an integrated circuit with an embedded capacitor.

FIG. 1 illustrates a capacitor structure 100 in a cross section. The capacitor structure 100 includes a capacitor dielectric 108 between a capacitor second plate 112 and a capacitor first plate 104. The capacitor dielectric 108 is a dielectric such as silicon dioxide, silicon nitride, silicon oxynitride, or a dielectric stack with several silicon dioxide and silicon nitride layers. The second and first capacitor plates, 112 and 104, are conductive materials, such as: doped polysilicon; a silicide, such as titanium silicide, cobalt silicide, nickel silicide, molybdenum silicide, and platinum silicide; or a metallic material, such as an aluminum and aluminum alloys, copper and copper alloys, tungsten, titanium-tungsten, tantalum nitride, and titanium nitride and alloys of these metallic materials.

In FIG. 1, the capacitor structure 100 is built on a non-conducting substrate 102. The non-conducting substrate can be a dielectric layer overlying a conductive substrate, an integrated circuit, or an isolation area such as shallow trench isolation (STI) within an integrated circuit. Electrical contact is made to the capacitor first plate 104 with a first metal filled contact or via 118 and electrical contact is made to the capacitor second plate 112 with a second metal filled contact or via 116.

The amount of charge, Q, that can be stored on a capacitor is given by Equation 1:

$$Q=CV \qquad (1)$$

Where: Q is charge in units of femtofarads (fF), C is the capacitance in units of femtofarads per volt (fF/V), and V is the voltage in units of volts applied to the capacitor plates across the capacitor dielectric (108 in FIG. 1).

The amount of charge that can be stored on a capacitor in an integrated circuit is limited by the breakdown voltage, $V_{BD}$, of the capacitor dielectric 108. A capacitor with a higher $V_{BD}$ can store more charge.

Figure 2:
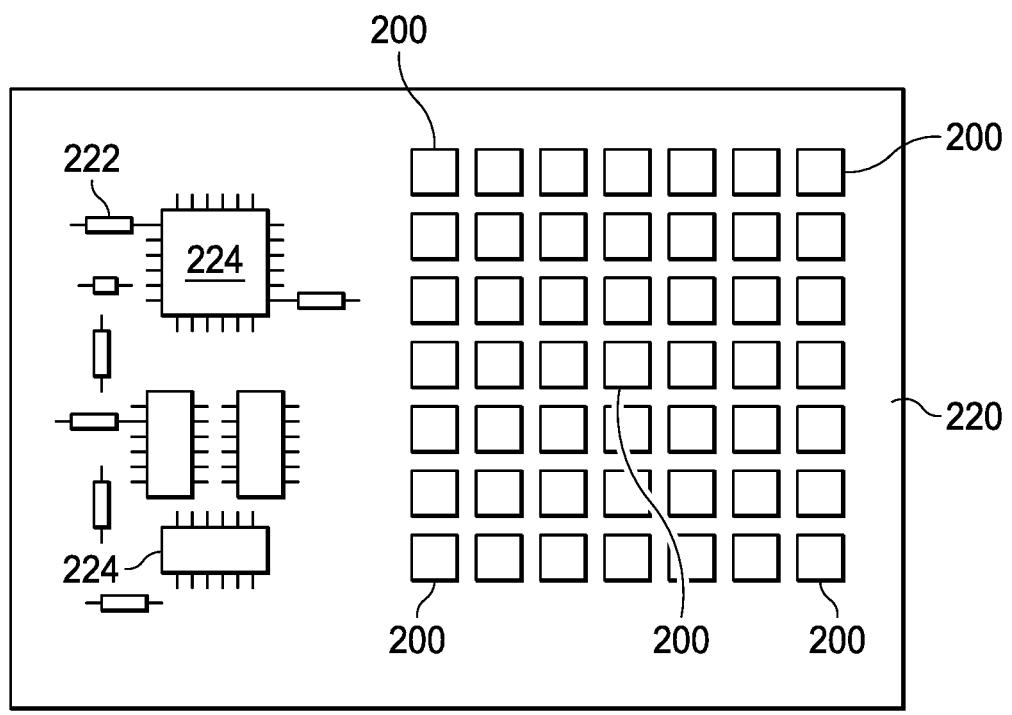
FIG. 2 is a plan view of an integrated circuit with an embedded high precision analog to digital capacitor array.

Integrated circuits (ICs) with analog to digital (A/D) converters (ADCs) use embedded high precision capacitors to accurately measure the electrical charge in an analog voltage signal and convert it to a digital voltage value. FIG. 2 is a plan view for an IC with an A/D converter. The A/D converter IC 220 has peripheral circuitry including transistors 224 and resistors 222 and an array of high precision capacitors 200. When an analog voltage signal is applied by the peripheral circuitry to the high precision capacitor array 200, depending upon the magnitude of the analog voltage signal, a different number of the individual high precision capacitors 220 in the array become fully charged. The number of high precision capacitors 220 that become fully charged is proportional to a digital value corresponding to the voltage.

The precision or number of bits of the digital voltage value is determined by the precision and matching of the high precision capacitors storing the electrical charge. A nonlinear response of capacitance to the analog voltage applied to the capacitor plates limits the precision of A/D conversion.

The voltage dependent capacitance C(V) of a capacitor is given by Equation 2:

$$C(V)=C_O(\alpha V^2+\beta V+1) \qquad (2)$$

Where: $C_O$ is a capacitance coefficient in units of fF/μm$^2$ at zero volts; α is the capacitance quadratic voltage coefficient (CQVC) in units of ppm/V$^2$; and β is the capacitance linear voltage coefficient (CLVC) in units of ppm/V.

Lower voltage coefficients, α and β, enable conversion of an analog voltage signal to a digital voltage value with higher precision. Precision capacitors can be formed in an integrated circuit using capacitor dielectrics such as silicon dioxide ($SiO_2$) (referred to as silicon dioxide, oxide, or O), silicon nitride ($Si_3N_4$) (referred to as SiN, silicon nitride, nitride, or N), and dielectric stacks such as ONO or NON stacks that are deposited using PECVD. In PECVD processes, silane ($SiH_4$) gas plus a nitrogen source such as ammonia ($NH_3$) or nitrogen ($N_2$) gas can be used to deposit PECVD SiN. $SiH_4$ and an oxygen source such as oxygen ($O_2$), nitrous oxide, or tetraethyl orthosilicate (TEOS) gas can be used to deposit PECVD $SiO_2$. Radio frequency high frequency power (RF-HF) is used for plasma excitation of the PECVD reaction, for example, an RF-HF signal at a frequency of 13.56 MHz is used in an existing commonly used PECVD tool.

In one arrangement the breakdown voltage ($V_{BD}$) of PECVD SiN is increased by replacing some or all the $NH_3$ during the PECVD SiN deposition with $N_2$. In example arrangements, $V_{BD}$ is further improved by adding radio frequency low frequency (RF-LF) power (400 kHz in an example PECVD tool) to break the N—N bonds in the $N_2$ gas. The use of RF-LF power increases the number of nitrogen-to-nitrogen (N—N) bonds and increases the number of silicon to nitrogen (Si—N) bonds in the SiN film, and reduces the number of Si—H and N—H bonds. N—N and Si—N bonds are stronger than N—H and Si—H bonds, and increasing the number of these bonds results in an increase in the breakdown voltage $V_{BD}$ of the SiN film. As is shown in Table 1, when the hydrogen content of the SiN film is reduced from about 28.4 atomic percent in the high hydrogen film to about 13 atomic percent in the low hydrogen-1 film, the breakdown voltage $V_{BD}$ is raised from about 25.8 V in the high hydrogen film to about 32.4 V in the low hydrogen-1 film.

Where "sccm" is the standard unit for flow rates, standard cubic centimeters per minute.

Figure 3:
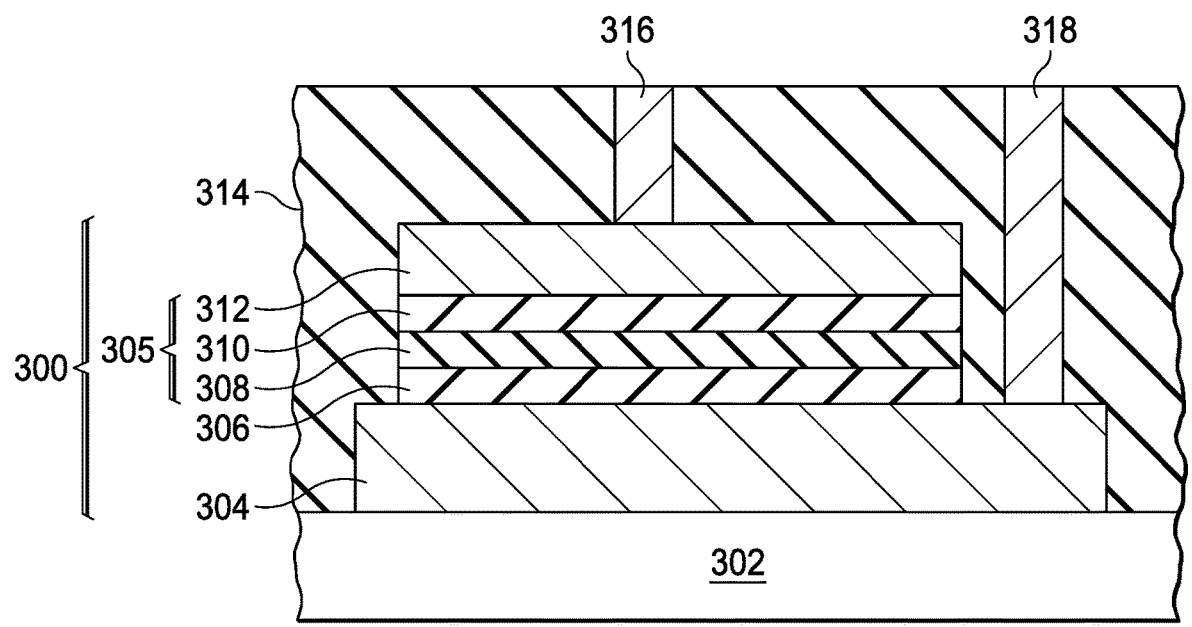
FIG. 3 is a cross section of an integrated circuit with an embedded capacitor that includes a stacked NON dielectric sandwiched between first and second capacitor plates.

FIG. 3 illustrates in a cross section a capacitor 300 with a NON dielectric stack 305. In FIG. 3 similar reference labels are used for similar elements shown in FIG. 1, for clarity. For example, substrate 302 in FIG. 3 corresponds to substrate 102 in FIG. 1. The capacitor 300 includes a NON dielectric stack 305 between a capacitor second plate 312 and a capacitor first plate 304. The capacitor first plate 304 is deposited before capacitor second plate 312. The NON dielectric stack 305 is a $SiO_2$ layer 308 sandwiched between a first SiN layer 306 and a second SiN layer 310. The target thicknesses of the silicon nitride and silicon dioxide layers in the NON dielectric stack are about equal thicknesses. The total thickness of the example NON stack dielectric in Table 1 is 30 nm (10 nm/10 nm/10 nm). In the example arrangements described hereinbelow, the second capacitor plate, 312, is tantalum nitride, and the first capacitor plate, 304, is cobalt silicide. Other arrangements can utilize other silicides or conductors as a capacitor first plate 304 and other conductors for the capacitor second plate 312. Metals and alloys of the metals can be used.

In Table 1 the breakdown voltage of the high hydrogen SiN film is 25.8 volts whereas the breakdown voltages of the low hydrogen films are 32.4 and 30.7 volts. The higher breakdown voltage enables a higher voltage to be applied to the capacitor in operations of the integrated circuit. This increases the capacitance (see Equation 1) and enables a smaller capacitor to be formed for a given capacitance, reducing the area and cost of the integrated circuit.

The process conditions for the high hydrogen and low hydrogen SiN films listed in Table 1 are given in Table 2. Radio frequency high frequency power (RF-HF) is sufficient to drive the reaction between $SiH_4$ and $NH_3$ to form SiN (for example, a frequency of 13.56 MHz can be used in an example PECVD tool). Radio frequency low frequency power (RF-LF) is added to drive the reaction between $SiH_4$ and $N_2$ to form SiN (400 kHz in an example PECVD tool). In column 2 of Table 1, the NON dielectric stack with the

TABLE 1

Stacked Capacitor Dielectric Films

|  | Units | High Hydrogen | Low Hydrogen-1 | Low Hydrogen-2 | Low Hydrogen-4 |
|---|---|---|---|---|---|
| SiN film |  | NON | NON | NON | ONO |
| capacitance per unit area | fF/μm² | 1.47 | 1.61 | 1.65 | 1.45 |
| $V_{BD}$ | Volts | 25.8 | 32.4 | 30.7 | 35.1 |
| Target Thickness | nm | 10/10/10 | 10/10/10 | 10/10/10 | 7.5/15/7.5 |
| TEM Thickness | nm | 25.1 (9.7/8.6/6.8) | 29.7 (12.3/8.3/9.1) | 25.7 (10.1/7.9/7.7) | na |
| % Hydrogen in SiN layer | Atomic % | 28.4 | 13 | — | 22 |

TABLE 2

Stacked Capacitor Dielectric Films

| SiN film | Pressure (Torr) | Temp ° C. | RF-HF Watts | RF-LF Watts | $SiH_4$ sccm | $NH_3$ sccm | $N_2$ sccm |
|---|---|---|---|---|---|---|---|
| High Hydrogen | 4 | 400 | 150 | 0 | 18 | 2150 | 4500 |
| Low Hydrogen-1 | 3.5 | 400 | 50 | 100 | 18 | 0 | 4500 |
| Low Hydrogen-2 | 2.5 | 400 | 50 | 100 | 25 | 60 | 4500 |
| Low Hydrogen-4 | 2 | 400 | 50 | 100 | 25 | 300 | 4500 | low hydrogen-1 SiN film has the lowest atomic percent hydrogen (13% H) and the highest breakdown voltage (32 volts). When depositing this SiN film, the NH₃ gas flow is turned off and the nitrogen in the SiN film is supplied from N₂ gas (See row 2 in Table 2).

The above described PECVD films are deposited in an example PECVD deposition tool with RF-HF of 13.56 MHz and with RF-LF of 400 kHz. The arrangements can be adapted by modifying the above PECVD deposition recipes to other recipes, and to recipes compatible with various PECVD deposition tools, to deposit NON, ONO, 0 and N dielectric films with improved $V_{BD}$.

A SiN film with high breakdown voltage can be deposited using SiH₄ and N₂ reaction gases and using PECVD with RF-HF power in the range of about 40 Watts to about 100 Watts, with RF-LF power in the range of about 80 Watts to about 200 Watts, temperature in the range of about 300° C. to 500° C., pressure in the range of about 2 Torr to about 5 Torr, with a SiH₄ flow rate between about 15 sccm and 50 sccm, with a N₂ flow rate between about 3000 sccm and 10000 sccm. Sometimes for other SiN film properties it is advantageous to add a small amount of NH₃ gas. A SiN film with improved $V_{BD}$ can be deposited using the above deposition conditions plus a NH₃ flow rate between about 0 sccm and 300 sccm.

The above arrangement is illustrated using an NON dielectric stacked capacitor. Other arrangements such as an ONO dielectric stacked capacitor can also be used to increase the $V_{BD}$. For example, the ONO dielectric stack with the low hydrogen-4 film in Table 1 has a $V_{BD}$ of 35 V. In alternative arrangements capacitor dielectric stacks with more layers of N and O such as an ONONO or an NONON stack can be used. Dielectric stacks of NON and ONO are preferred because additional ON interfaces can add defects which can adversely affect the $V_{BD}$ of the capacitor.

High precision capacitors used in analog-to-digital (A/D) integrated circuits can be formed using a dielectric stack such as NON and ONO. N and O dielectric stacks are used, in part, because these dielectric stacks have smaller capacitance nonlinearity than a capacitor dielectric of a single layer of silicon dioxide or silicon nitride. The nonlinearity of silicon nitride films is opposite sign to the nonlinearity of silicon dioxide films so that a dielectric stack with both N and O layers can have a nonlinearity that is less than either the N or O single layer dielectric.

High precision capacitors in ADCs are used to accurately measure the amount of charge in an analog signal and convert it to a digital value. The precision of the digital value (number of bits) is determined by how accurately the precision capacitor measures the charge in the analog signal. One difficulty is that capacitance changes with applied voltage in a nonlinear fashion as given by Equation (2). The quadratic term, $\alpha V^2$, determines the nonlinear change in capacitance C(V) with voltage. The magnitude of this term limits the precision of the converted A/D signal. The quadratic response of a capacitor with a NON or ONO dielectric stack can be minimized by optimizing the thicknesses of the N and O films in the dielectric stack. The quadratic response of SiO₂ (O) is opposite to SiN (N) (see Table 3). In an arrangement, after optimizing the thicknesses of the O and N films in the dielectric stack to minimize nonlinearity, the quadratic response of an ONO or NON capacitor dielectric stack can additionally be reduced by lowering the atomic percentage of hydrogen in the SiN layer in the dielectric stack. ONO is the preferred dielectric stack in high precision capacitors and is used below for illustration.

Figure 4:
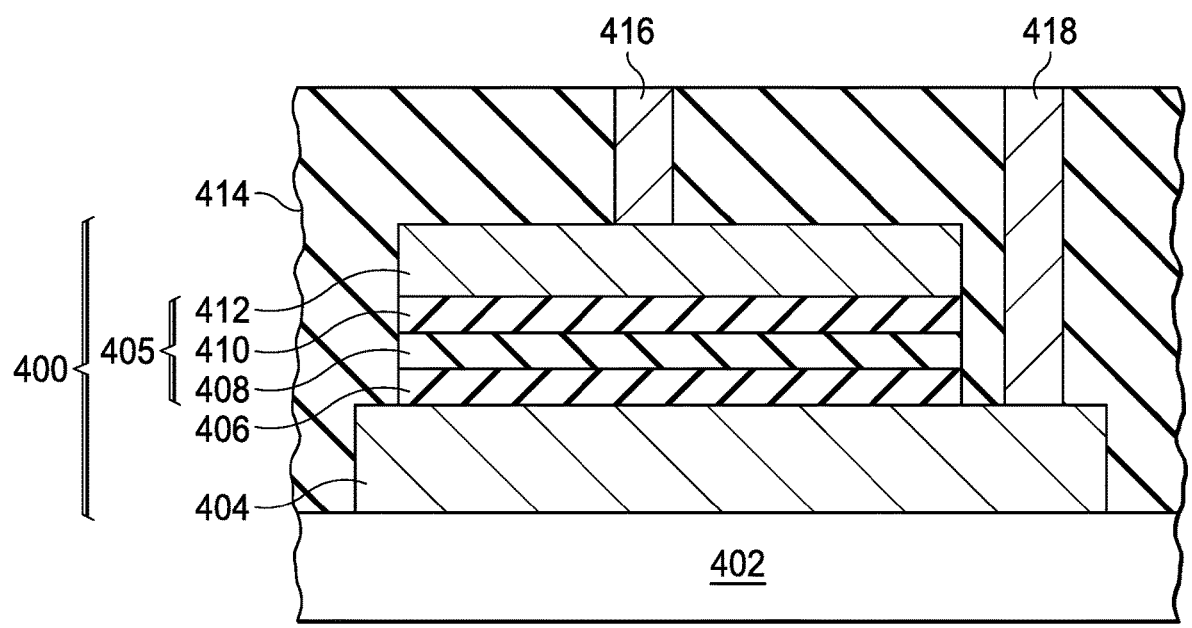
FIG. 4 is a cross section of an integrated circuit with an embedded capacitor that includes a stacked ONO dielectric sandwiched between first and second capacitor plates.

FIG. 4 illustrates in another cross section a capacitor 400 with an ONO dielectric stack 405. In FIG. 4 similar reference labels are used for similar elements shown in FIG. 1, for clarity. For example, substrate 402 in FIG. 4 corresponds to substrate 102 in FIG. 1. The capacitor structure 400 is an ONO dielectric stack 405 sandwiched between a second capacitor plate 412 and a first capacitor plate 404. The ONO dielectric stack 405 is a SiN layer 408 sandwiched between a first SiO₂ layer 406 and a second SiO₂ layer 410. The target thickness of the silicon dioxide/silicon nitride/silicon dioxide (ONO) dielectric stacks in the example dielectric stack in Table 3 is 30 nm (7.5 nm/15 nm/7.5 nm). In this arrangement the thicknesses of the first 408 and second 410 O layers are about half the thickness of the N layer 408. In the arrangements described below the second capacitor plate, 412 is TaN and the first capacitor plate 404 is cobalt silicide. Other arrangements can use other silicides or other metals or alloys as a first capacitor plate 404 and as the second capacitor plate 412.

TABLE 3

Stacked Capacitor Dielectric Films

| | Units | Low H 3 | | High H | High H | Low H 3 | Low H 4 |
|---|---|---|---|---|---|---|---|
| film | | Si₃N₄ | SiO₂ | NON | ONO | ONO | ONO |
| capacitance per unit area | fF/µm² | 1.61 | 1.65 | 1.65 | 1.38 | 1.5 | 1.45 |
| Breakdown | Volts | 18.8 | 26.9 | 30.5 | 32.1 | 33 | 35.1 |
| Target Thickness | nm | 300 | 300 | 10/10/10 | 7.5/15/7.5 | 7.5/15/7.5 | 7.5/15/7.5 |
| VCLC (β) | ppm/V | −19.58 | −4.20 | −4.79 | −6.36 | −2.38 | −2.85 |
| VCQC (α) | ppm/V² | 6.52 | −4.89 | 2.92 | 0.41 | −0.29 | −0.08 |
| % Hydrogen in SiN layer | Atomic % | 28.4 | na | 28.4 | 28.4 | 21 | 22 |

TABLE 4

Stacked Capacitor Dielectric Films

| SiN film | Pressure (Torr) | Temp ° C. | RF-HF Watts | RF-LF Watts | SiH₄ sccm | NH₃ sccm | N₂ sccm |
|---|---|---|---|---|---|---|---|
| High Hydrogen | 4 | 400 | 150 | 0 | 18 | 2150 | 4500 |
| Low Hydrogen 3 | 2 | 400 | 50 | 100 | 25 | 180 | 4500 |
| Low Hydrogen 4 | 2 | 400 | 50 | 100 | 25 | 300 | 4500 |

As shown in column 8 in Table 3, the low hydrogen-4 ("Low H 4") film has a capacitance quadratic voltage coefficient, α, of −0.08 ppm/V². This α is smaller than the α of other ONO dielectric stacks in Table 3. The reduced capacitance nonlinearity with this small α enables the conversion of an analog signal to a digital signal with a higher number of bits (increased precision).

As shown in row seven of Table 3, labeled "% Hydrogen in SiN layer", the high hydrogen silicon nitride films have a hydrogen content of 28 atomic percent or greater. The low hydrogen silicon nitride films have hydrogen content of 22 atomic percent or less. The hydrogen content of a low hydrogen content silicon nitride film is preferred to be less than about 25 atomic percent for a capacitance quadratic voltage coefficient (CQVC) of less than about +/−0.5 ppm/V². It is more preferred for the hydrogen content of the silicon nitride film to be less than about 20 atomic percent.

The PECVD depositions listed in Tables 3 and 4 in this example are performed in an example PECVD deposition tool with radio frequency high frequency (RF-HF) of 13.56 MHz and with radio frequency low frequency (RF-LF) of 400 kHz. Additional arrangements can be formed by adapting the above PECVD deposition recipes to other recipes and to additional recipes compatible with various other PECVD deposition tools to deposit NON and ONO dielectric stacks with improved linearity.

The process conditions for the low hydrogen-4 SiN layer in the ONO dielectric stack are given in row 4 in Table 4. The flow rate of $NH_3$ is 15 times less than the flow rate of $N_2$, or even lower. The low $NH_3$ to $N_2$ flow ratio in the reaction gas mixture gives rise to the small α (−0.08 ppm/V²) (see Equation 2 herein above).

A low hydrogen content SiN film with a small α may be deposited using $N_2$, $NH_3$, and $SiH_4$ reaction gases and using PECVD with RF-HF power in the range of about 40 Watts to about 100 Watts, with RF-LF power in the range of about 80 Watts to about 200 Watts, temperature in the range of about 300° C. to 500° C., pressure in the range of about 2 Torr to about 5 Torr, with a $SiH_4$ flow rate between about 15 sccm and 50 sccm, with a $N_2$ flow rate between about 3000 sccm and 10000 sccm, and with a $NH_3$ flow rate between about 0 sccm and 300 sccm. Deposition conditions for the example ONO dielectric stack with the low α listed in Table 3 are given in Table 4.

The O films in the ONO dielectric stack in this example are deposited using the same deposition conditions as the N film with $O_2$ gas flow turned on, with the $NH_3$ gas flow turned off and with the RF-LF power turned off. Other deposition conditions and deposition gases can be used to deposit the O films.

Figure 5:
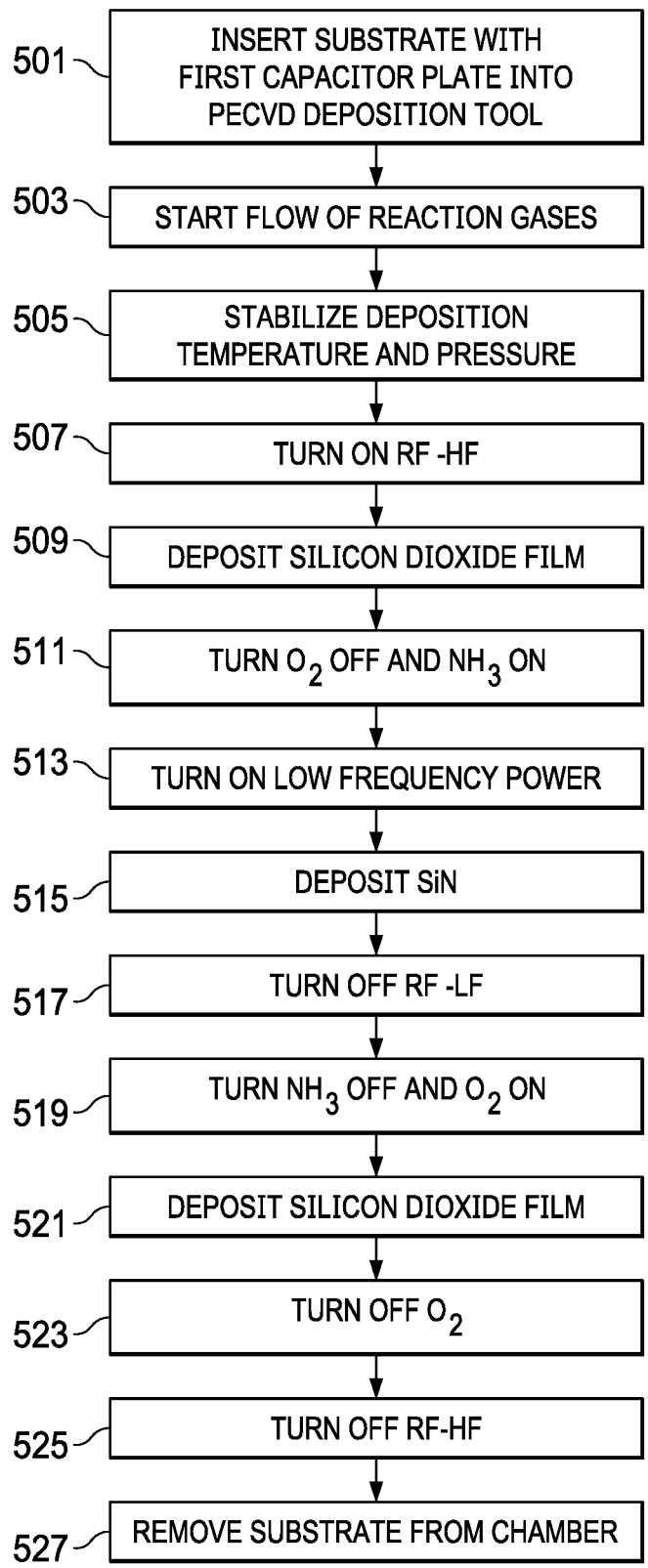
FIG. 5 is a flow diagram of a method for forming an integrated circuit with an embedded capacitor that includes a stacked ONO dielectric with a quadratic voltage coefficient less than 0.5 ppm/V$^2$.

FIG. 5 is a flow diagram a process arrangement for PECVD deposition of an ONO dielectric stack with low nonlinearity. The flow diagram is for an ONO dielectric stack but can readily be adapted for deposition of a NON dielectric stack or for an ON or NO dielectric stack.

In step 501 a substrate such as an integrated circuit wafer with a capacitor first plate formed thereon is loaded into the PECVD tool deposition chamber. The capacitor first plate can be formed on a non-conductive substrate, such as a dielectric layer overlying an integrated circuit or on an isolation dielectric on a substrate. The capacitor first plate can be any conductive material, such as doped single crystal silicon, doped polysilicon, silicides, metals and alloys. In the arrangements for the examples shown in Tables 1 and 3, the first plate is cobalt silicide formed on doped polysilicon.

In step 503 the reaction gases start flowing into the deposition chamber. In this arrangement the deposition gasses for the $SiO_2$ layer are $SiH_4$ and $N_2O$ with $N_2$ carrier gas. Other gases such as $SiH_2Cl_2$, $Si_2H_6$, to provide the silicon atoms and other gases such as $O_2$, NO and TEOS to provide the oxygen atoms can also be used with appropriate changes to the deposition conditions to deposit the $SiO_2$ layer.

In step 505 the deposition temperature and pressure are stabilized. In an example deposition, the temperature is stabilized at about 400° C. and the pressure is stabilized at about 2 Torr.

In step 507 the RF-HF power is turned on. In an example the RF-HF power is about 50 W at 13.56 MHz.

In step 509 the first $SiO_2$ layer of the ONO dielectric stack is deposited onto the capacitor first plate.

In step 511, after the desired thickness of the first $SiO_2$ layer is deposited, the flow of the $N_2O$ gas is stopped and the flow of the $NH_3$ gas is started. Turning off the flow of the $N_2O$ gas stops the deposition of the first $SiO_2$ dielectric layer. As shown in Table 4, a high flow rate of $N_2$ gas (4500 sccm) along with a low flow rate of $NH_3$ gas (300 sccm or less) is used to deposit a silicon nitride film with low hydrogen content (less than 25 atomic percent hydrogen). The ratio of the flow rate of $NH_3$ to $N_2$ is preferred to be 1:15 or less. For some applications such as those that may benefit from a higher $V_{BD}$, the $NH_3$ flow rate may be turned off.

In step 513 the RF-LF power is turned on. This initiates the reaction between $SiH_4$ and $N_2$ to deposit the low hydrogen SiN layer in the ONO dielectric stack. In one example the RF-LF power is about 100 W at 400 kHz.

In step 515 the desired thickness of the SiN layer is deposited.

In step 517 the RF-LF power is turned off. This stops the SiN layer deposition from the reaction of $SiH_4$ and $N_2$.

In step 519 the $NH_3$ flow is stopped and the $N_2O$ flow is started. Stopping the $NH_3$ flow stops the SiN layer deposition from the reaction of $SiH_4$ and $NH_3$. Restarting the $N_2O$ flow initiates deposition of the second $SiO_2$ layer in the ONO dielectric stack.

After the desired thickness of the second $SiO_2$ layer is deposited the $O_2$ flow is turned off stopping the $SiO_2$ layer deposition. In this example, the thickness of the first and second silicon dioxide layers is about half the thickness of the silicon nitride layer.

In step 525 the RF-HF power is turned off and in step 527 the substrate with the ONO dielectric stack is removed from the PECVD deposition chamber.

Subsequent steps can then be performed to deposit the capacitor second plate. A capacitor second plate pattern can then be formed on the capacitor second plate and the capacitor second plate and the ONO dielectric stack can be etched to form the capacitor dielectric structure 405 and capacitor second plate structure 412 shown in FIG. 4. A capacitor first plate pattern can then be formed and the capacitor first plate 404 etched to form the capacitor first plate structure 404 shown in FIG. 4.

The low hydrogen N films in the ONO or NON dielectric of the arrangements significantly lowers the value of the nonlinear voltage coefficient in a precision capacitor, which significantly improves the performance of A/D converters using capacitors of the arrangements and reduces the cost of integrated circuits with A/D converters.

In addition, in the arrangements the hydrogen content of the N films is reduced. Reducing the hydrogen content in the N films in the ONO or NON dielectric stack in a high voltage capacitor raises the breakdown voltage of the high voltage capacitor, which enables the integrated circuit to operate at a higher voltage while incurring no additional cost.

Modifications are possible in the described arrangements, and other alternative arrangements are possible within the scope of the claims.

What is claimed is:

1. A method for forming an integrated circuit with an embedded capacitor, comprising:
   forming a capacitor first plate over a semiconductor substrate; and
   depositing over the capacitor first plate a dielectric stack comprised of alternating layers of plasma enhanced chemical vapor deposition (PECVD) silicon dioxide and PECVD silicon nitride;
   wherein depositing the PECVD silicon nitride comprises depositing silicon nitride with an atomic hydrogen content less than 25% using $N_2$ as a nitrogen source while applying radio frequency low frequency (RF-LF) power.

2. The method of claim 1, wherein depositing the dielectric stack further comprises:
   PECVD depositing a first layer of silicon dioxide, a layer of silicon nitride, and a second layer of silicon dioxide wherein a thickness of the silicon dioxide layers is about half a thickness of the silicon nitride layer; and
   while depositing the silicon nitride layer, flowing $NH_3$ and $N_2$ gasses with a flow ratio of 1:15 or less.

3. The method of claim 2, wherein depositing the PECVD silicon nitride includes depositing while applying an RF-LF power in a range of 80 W to 200 W, while using a $N_2$ flow rate in a range of 3000 sccm to 10000 sccm, while using a $NH_3$ flow rate in a range of 0 sccm to 300 sccm.

4. The method of claim 2, wherein depositing the PECVD silicon nitride includes depositing silicon nitride while applying a RF-LF power of about 100 W at 400 kHz, while using an $N_2$ flow rate of about 4500 sccm, and while using an $NH_3$ flow rate of about 300 sccm.

5. The method of claim 1, wherein the dielectric stack is a silicon dioxide, silicon nitride, silicon dioxide stack having a thickness of silicon dioxide layers that is about half a thickness of a silicon nitride layer, and wherein the silicon nitride is PECVD deposited with a RF-LF power in a range of 80 W to 200 W, while using a $N_2$ flow rate in a range of 3000 sccm to 10000 sccm, and while using a $NH_3$ flow rate of less than 10 sccm.

6. The method of claim 1, wherein the dielectric stack comprises a first silicon dioxide layer with a first thickness, a second silicon nitride layer with a second thickness, and a third silicon dioxide layer with a third thickness, and wherein the first thickness and the third thickness are about equal and wherein the second thickness is about double the first and third thickness, and the PECVD silicon nitride is PECVD deposited with an RF-LF power of about 100 W at 400 kHz, a $N_2$ flow rate of about 4500 sccm, and an $NH_3$ flow rate of about 0 sccm.

7. The method of claim 1, wherein the dielectric stack comprises a first silicon nitride layer with a first thickness, a second silicon dioxide layer with a second thickness, and a third silicon nitride layer with a third thickness and the first, second, and third thicknesses are about equal; and wherein the PECVD silicon nitride is PECVD deposited while applying an RF-LF power in a range of 80 W to 200 W, with an $N_2$ flow rate in a range of 3000 sccm to 10000 sccm, and a $NH_3$ flow rate is 0 sccm.

8. The method of claim 1, wherein the dielectric stack comprises a first silicon nitride layer with a first thickness, a second silicon dioxide layer with a second thickness, and a third silicon nitride layer with a third thickness and the first, second, and third thicknesses are about equal, and wherein the PECVD silicon nitride is PECV deposited while applying an RF-LF power of about 100 W, with an $N_2$ flow rate of about 4500 sccm, and an $NH_3$ flow rate of 0 sccm.

9. A method for forming an integrated circuit with an embedded capacitor, comprising:
   forming a capacitor first plate on a dielectric layer over a semiconductor substrate; and
   depositing over the capacitor first plate a dielectric stack comprising a first layer of plasma excited chemical vapor deposition (PECVD) silicon dioxide with a first thickness, a first layer of PECVD silicon nitride with a second thickness, and a second layer of silicon dioxide with the first thickness that is about half the second thickness;
   wherein depositing the PECVD silicon nitride includes performing deposition while applying $N_2$ and $NH_3$ gasses with a flow rate ratio of an $NH_3$ flow rate to an $N_2$ flow rate of 1:15 or less, and while applying a radio frequency low frequency (RF-LF) power.

10. The method of claim 9, wherein the PECVD silicon nitride is deposited with an RF-LF power in a range of 80 W to 200 W, an $N_2$ flow rate in a range of 3000 sccm to 10000 sccm, and an $NH_3$ flow rate in a range of 0 sccm to 300 sccm.

11. The method of claim 9, wherein the PECVD silicon nitride is deposited with an RF-LF power of about 100 W at 400 kHz, an $N_2$ flow rate of about 4500 sccm, and an $NH_3$ flow rate of about 300 sccm.

* * * * *